United States Patent
Strassburg et al.

(10) Patent No.: US 6,673,641 B1
(45) Date of Patent: Jan. 6, 2004

(54) CONTACT STRUCTURE FOR AN ELECTRIC II/VI SEMICONDUCTOR COMPONENT AND A METHOD FOR THE PRODUCTION OF THE SAME

(75) Inventors: Matthias Strassburg, Berlin (DE); Oliver Schulz, Berlin (DE); Udo W. Pohl, Berlin (DE); Dieter Bimberg, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 5 days.

(21) Appl. No.: 10/111,661

(22) PCT Filed: Nov. 17, 2000

(86) PCT No.: PCT/EP00/11488

§ 371 (c)(1),
(2), (4) Date: Apr. 24, 2002

(87) PCT Pub. No.: WO01/37385

PCT Pub. Date: May 25, 2001

(30) Foreign Application Priority Data

Nov. 17, 1999 (DE) .......................................... 199 55 280

(51) Int. Cl.$^7$ ................................................ H01L 21/00
(52) U.S. Cl. .......................................... 438/22; 438/603
(58) Field of Search .......................... 438/22, 24, 597, 438/602, 603, 605

(56) References Cited

U.S. PATENT DOCUMENTS 4,851,302 A * 7/1989 Nakagawa et al.
5,068,204 A * 11/1991 Kukimoto et al.
5,786,269 A    7/1998 Murakami

FOREIGN PATENT DOCUMENTS

JP          6318343      * 7/1988

OTHER PUBLICATIONS

Honda, et al., "Formation of highly conductive p–type ZnSe Using Li3N diffusion," Jpn J Appl Phys, vol. 35 (No. 7), p. 3878–9, ( Apr. 23, 1996).
Kijima, et al., "Optimized ZnSe:N/ZnTe:N contact structure of ZnSe–based II–IV laser diodes," Applied Physics Letters, American Inst. of Physics (USA), vol. 73 ( No. 2), p. 235–7, ( Apr. 23, 1998).
Lim, et al., "High p–type doping of ZnSe using Li3N diffusion," Applied Physics Letters, Amer. Inst. of Physics (USA), vol. 65 ( No. 19), p. 2437–8, ( Nov. 7, 1994).
Kato, et al., "Significant progress in II–VI blue–green laser diode lifetime," Electronics Letters, vol. 34 ( No. 3), p. 282–284, ( Feb. 5, 1998).
Ozawa, et al., "Au(Pt)(Pd) Ohmic Contacts to p–ZnTe," Electronics Letters, vol. 29 ( No. 5), p. 503–505, (Mar. 4, 1993).

* cited by examiner

*Primary Examiner*—Savitri Mulpuri
(74) *Attorney, Agent, or Firm*—Hahn Loeser + Parks LLP; Stephen L. Grant

(57) ABSTRACT

A process for the production of contacts for electrically operated II/VI semiconductor structures (for example laser diodes). The contact materials palladium and gold hitherto used in relation to electrically operated II/VI semiconductor lasers are distinguished by a relatively great, not purely ohmic specific contact resistance in relation to the II/VI cover layer. The consequentially necessary higher operating voltages result in the unnecessary generation of heat and thus substantially accelerate degradation of the entire laser structure. That effect causes a limitation in terms of the service life of II/VI semiconductor laser diodes. The invention permits the operation of semiconductor laser diodes with lower operating voltages. The II/VI semiconductor laser diodes produced with our invention are distinguished by a longer service life. That permits inter alia commercial use of semiconductor laser diodes in the blue-green spectral range.

10 Claims, 1 Drawing Sheet

CONTACT STRUCTURE FOR AN ELECTRIC II/VI SEMICONDUCTOR COMPONENT AND A METHOD FOR THE PRODUCTION OF THE SAME

The invention concerns a contact structure for an electrically operated II/VI semiconductor element, as is known from the works by T. Honda, S. W. Lim, K. Yanashima, K. Inoue, K. Hara, H. Munekata, H. Kukimoto, F. Koyama and K. Iga, Jpn. J. Appl. Phys., 35, 3878 (1996) and S. W. Lim, T. Honda, F. Koyama, K. Iga, K. Inoue, K. Yanashima, H. Munekata and H. Kukimoto, appl. Phys. Lett. 65, 2437 (1994), and a process for the production thereof.

BACKGROUND OF THE ART

Semiconductor elements such as for example semiconductor laser diodes represent an essential basis of modern information and data processing systems and future display systems. While such laser diodes are available for the infrared, red and blue-violet spectral range, it has hitherto not been possible to produce a green semiconductor laser which enjoys an adequate service life. The most promising approach in terms of embodying a green semiconductor laser is based on II/VI semiconductor structures with ZnTe-bearing cover layers, but the service life of those components is still not satisfactory for commercial use (see E. Kato, H. Noguchi, M. Nagai, H. Okuyama, S. Kijima, and A. Ishibashi, Elec. Lett. 34, 282 (1998)).

Hitherto, those II/VI semiconductor laser structures with ZnTe-bearing cover layers were contacted by metals, typically palladium which is deposited on the semiconductor surface. Then platinum and/or gold are deposited on the palladium layer (see M. Haase, J. Qui, J. M. DePuydt, and H. Cheng; Appl. Phys. Lett. 59, 1272 (1991), M. Ozawa, F. Hiei, A. Ishibashi, and K. Akikmoto, Elect. Lett. 29.503 (1993) and S. Kijima, H. Okuyama, Y. Sanaka, T. Kobaayshi, S. Tomiya, and A. Ishibashi; Appl. Phys. Lett. 73; 235 (1998)). The operation of applying those layers is carried out by means of vapor deposition, for example thermal vapor deposition or electron beam vapor deposition. The use of lithium nitride in II/VI semiconductor technology is hitherto only known as a doping material, in which case the material is diffused in at temperatures of between 350° C. and 570° C. (see T. Honda, S. W. Lim, K. Yanashima, K. Inoue, K. Hara, H. Munekata, H. Kukimoto, F. Koyama and K. Iga, Jpn. J. Appl. Phys., 35, 3878 (1996) and S. W. Lim, T. Honda, F. Koyama, K. Iga, K. Inoue, K. Yanashima, H. Munekata and H. Kukimoto, Appl. Phys. Lett. 65, 2437 (1994)). A laser use presupposes a doping concentration of at least $10^{18}$ cm$^{-3}$. That was only approximately attained at a temperature of 470° C., with that process. That temperature however would trigger off diffusion effects (for example of Cd) in the deeper laser layers, so that the consequence would be destruction of the laser structure. Therefore that process cannot be applied in laser technology.

The heat which is generated during electrical operation of the laser diode, for example due to the contact resistance at the contact, contributes substantially to the degradation of the entire structure.

SUMMARY OF THE INVENTION

A reduction in contact resistance is achieved by the present invention. A long service life for the contact structure is also ensured.

The process includes the application of lithium nitride (Li$_3$N) in a layer thickness of typically between 2 nm and 20 nm, to II/VI semiconductor structures, for example with ZnTe-bearing cover layers. That is effected for example by means of thermal vapor deposition, electron beam vapor deposition or vacuum sputtering. In combination with the covering of the lithium nitride layer, by means of cover layers, such as for example palladium and/or gold/platinum, oxidation of the lithium nitride in air is prevented. Typical layer thicknesses for those coverings are between 5 nm and 1 μm. In order to protect the side faces of the lithium nitride layer from oxidation, some embodiments provide that insulating materials (for example silicon nitride) can be applied. The operation of tempering the structure results in a further reduction in the contact resistance. In addition that enhances the durability of the contact. A further possible way of improving the contact properties (for example adhesion of the lithium nitride to the sample surface) is afforded by the use of thin bonding layers (for example metalization layers) between the semiconductor and the lithium nitride.

The contact resistance of II/VI semiconductor structures (for example laser diodes) and thus the thermal stressing thereof can be greatly reduced by the use of that lithium nitride layer. That results in a slower rate of degradation of those components and thus affords longer service lives.

Commercial availability of green semiconductor laser diodes opens up a large number of possible uses such as laser television or an improvement in laser printing.

BRIEF DESCRIPTION OF THE DRAWING

An embodiment of a contact structure according to the invention is shown in FIG. 1.

Figure 1:
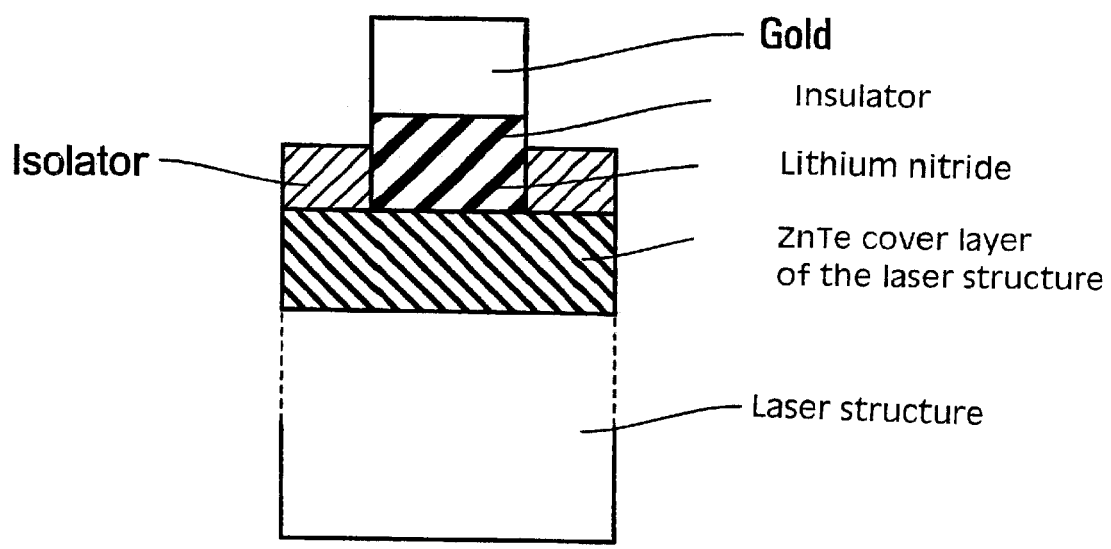

| | |
|---|---|
| ZnTe: | zinc telluride |
| Li$_3$N: | lithium nitride |
| Cd: | cadmium |

DETAILED DESCRIPTION OF A PREFERRED EMBODIMENT

The process includes the application of lithium nitride (Li$_3$N) in a layer thickness of typically between 2 nm and 20 nm, to II/VI semiconductor structures, for example with ZnTe-bearing cover layers. That is effected for example by means of thermal vapor deposition, electron beam vapor deposition or vacuum sputtering. In combination with the covering of the lithium nitride layer, by means of cover layers, such as for example palladium and/or gold/platinum, oxidation of the lithium nitride in air is prevented. Typical layer thicknesses for those coverings are between 5 nm and 1 μm. In order to protect the side faces of the lithium nitride layer from oxidation, some embodiments provide that insulating materials (for example silicon nitride) can be applied. The operation of tempering the structure results in a further reduction in the contact resistance. In addition that enhances the durability of the contact. A further possible way of improving the contact properties (for example adhesion of the lithium nitride to the sample surface) is afforded by the use of thin bonding layers (for example metalization layers) between the semiconductor and the lithium nitride.

The contact resistance of II/VI semiconductor structures (for example laser diodes) and thus the thermal stressing thereof can be greatly reduced by the use of that lithium nitride layer. That results in a slower rate of degradation of those components and thus affords longer service lives.

Commercial availability of green semiconductor laser diodes opens up a large number of possible uses such as laser television or an improvement in laser printing.

What is claimed is:

1. A process for forming an electrically operated II/VI semiconductor laser structure comprising a semiconductor and a further contact layer, the process comprising the step of:

applying lithium nitride ($Li_3N$) as a contact material between the semiconductor and the further contact layer by vapor deposition or sputtering to form the II/VI semiconductor laser structure.

2. The process of claim 1, comprising:

covering the lithium nitride layer by more contact layers.

3. The process of claim 1, comprising:

protecting the lithium nitride layer laterally by insulating layers.

4. The process of claim 3, comprising:

tempering a resultant semiconductor laser structure after the applying operation.

5. The process of claim 1, wherein a thin bonding layer is used between the semiconductor and the lithium nitride.

6. The process of claim 1, comprising:

covering the lithium nitride layer further contact layers.

7. The process of claim 5, wherein the thin bonding layer is applied by metalization.

8. A contact structure for an electrically operated II/VI semiconductor element comprising:

a p-doped semiconductor layer of II/VI semiconductor material which is joined by way of a contact layer to a metal contact, wherein the contact layer comprises lithium nitride and is of a thickness of between 2 nm and 20 nm; and at least one further contact layer is arranged between the contact layer of lithium nitride and the metal contact;

wherein the contact layer of lithium nitride is protected laterally by insulating layers.

9. The contact structure of claim 8, wherein a thin bonding layer is arranged between the semiconductor laser of II/VI semiconductor material and the contact layer of lithium nitride.

10. The contact structure of claim 8, wherein the II/VI semiconductor element includes a laser structure.

* * * * *